United States Patent

[11] 3,586,874

[72] Inventor Armand P. Ferro
Troy, N.Y.
[21] Appl. No. 849,810
[22] Filed Aug. 13, 1969
[45] Patented June 22, 1971
[73] Assignee General Electric Company

[54] INTEGRATED CIRCUIT PERIODIC RAMP GENERATOR
3 Claims, 4 Drawing Figs.

[52] U.S. Cl. ........................................................ 307/228,
307/229, 307/252 B, 307/324
[51] Int. Cl. ........................................................ H03k 17/00
[50] Field of Search ............................................ 307/229,
230, 252.21

[56] References Cited
UNITED STATES PATENTS
3,350,574 10/1967 James ........................... 307/229 X
3,497,724 2/1970 Harper ........................... 307/230 X OTHER REFERENCES
ELECTRONIC DESIGN, " Thyristor triggering is surefire with SUS and SBS." 8/66, pp. 38 to 42, copy in 307/252.

*Primary Examiner*—Donald D. Forrer
*Assistant Examiner*—B. P. Davis
*Attorneys*—John F. Ahern, Paul A. Frank, Donald R. Campbell, Frank L. Neuhauser, Oscar B. Waddell and Joseph B. Forman

ABSTRACT: A temperature stable, low source impedance periodic ramp voltage generator capable of both positive and negative output voltage polarity, or only either one of these, is fabricated in large part as an integrated circuit. The generator comprises the combination of an operational amplifier used as an integrator and a bilateral or unilateral voltage-sensitive switching device, such as a silicon bilateral switch or a silicon unilateral switch, for periodically discharging the feedback capacitor of the integrating circuit.

Inventor:
Armand P. Ferro,
by Donald R. Campbell
His Attorney.

INTEGRATED CIRCUIT PERIODIC RAMP GENERATOR

This invention relates to a circuit for generating a periodic ramp voltage waveform, and more particularly to a stable low-impedance periodic ramp generator fabricated at least in part as an integrated circuit. This periodic ramp generator, depending on the choice of components, is capable of producing both positive and negative polarity output voltages or either one of these.

A periodic ramp voltage waveform is commonly called a sawtooth voltage and has been produced by many different circuit configurations for a variety of applications. A widely used ramp generator employed as an integral part of a circuit which can be used for generating a string of narrow pulses or the periodic ramp voltage waveform comprises the series combination of a charging resistor and a capacitor whose junction point is connected to the voltage sensitive emitter of a unijunction transistor. When the peak point voltage or emitter breakdown voltage is reached, the unijunction transistor conducts and discharges the capacitor through a base resistor connected between one base electrode and the other terminal of the capacitor, thereby producing a pulse. To improve the linearity of the ramp voltage, the charging resistor in the RC network is replaced by a bilateral transistor using the collector characteristic to obtain a constant current source. The ramp voltage developed by the capacitor is then a linear function of time since the voltage is the integral of the constant charging current. Ramp and pulse generators of this type made from discrete components are described in the Silicon Controlled Rectifier Manual, 4th Edition, Copyright 1967, or the Transistor Manual, 7th Edition, Copyright 1964, both obtainable from the Semiconductor Products Department, General Electric Company, Electronics Park, Syracuse, New York. The ordinary unijunction transistor is used to generate positive ramps whereas the complementary unijunction transistor is used for generating negative ramps. The internal characteristics of these two solid state devices are different. The ordinary unijunction transistor utilizes the mechanism of conductivity modulation of the bulk silicon, but the complementary unijunction transistor is actually a small integrated circuit using the basic mechanism of PNPN action (see Application Note 90.72 on the complementary unijunction transistor dated Feb. 1968 and obtainable from the same address as given above). In both of these circuits the impedance at the emitter of the unijunction transistor is high, and they are moreover sensitive to temperature changes as well as circuit loading. Further because of the less than ideal input emitter characteristic of the unijunction transistor, some of the constant current from the bilateral transistor is diverted to the unijunction emitter thus making the ramp voltage subject to nonlinearities. As a result, the period of the ramp changes considerably with all of these variables.

Accordingly, an object of the invention is to provide a new and improved periodic ramp generator circuit capable of both positive and negative output voltages and of being manufactured in large part as an integrated circuit.

Another object is the provision of an integrated circuit periodic ramp generator that is temperature stable and has low source impedance, and is simple, accurate, and flexible.

Yet another object is to provide a relatively simple circuit for producing a highly linear periodic ramp voltage waveform which uses integrated circuit components and has an output voltage of either polarity or both polarities depending on the choice of components.

In accordance with the invention, a periodic ramp voltage generator using integrated circuits comprises the combination of an integrating circuit employing an operational amplifier and voltage-sensitive switching means for periodically discharging the feedback capacitor of the integrating circuit. More particularly, the integrating circuit produces a ramp voltage in response to the application of a constant input unidirectional voltage and includes an integrated circuit operational amplifier, an input resistor connected to one of its input terminals, and a feedback capacitor connected between that amplifier input terminal and the output terminal of the operational amplifier. The voltage-sensitive switching means is preferably an integrated circuit bilateral or unilateral voltage-sensitive breakover switching device and is connected across the feedback capacitor to periodically discharge the feedback capacitor upon charging to a predetermined voltage. When a bilateral breakover switching device is used, both positive and negative polarity periodic ramp voltages are generated depending on the polarity of the input voltage.

The foregoing and other objects, features, and advantages of the invention will be apparent from the following more particular description of several preferred embodiments of the invention, as illustrated in the accompanying drawing wherein.

Figure 1:
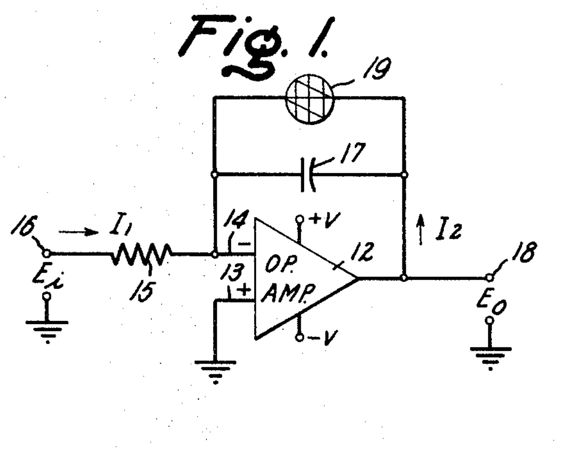
FIG. 1 is a schematic circuit diagram of the periodic ramp generator using integrated circuits constructed in accordance with the preferred embodiment of the invention wherein the voltage-sensitive switching device is a bilateral device and both positive and negative output voltages are produced.
Figure 3:
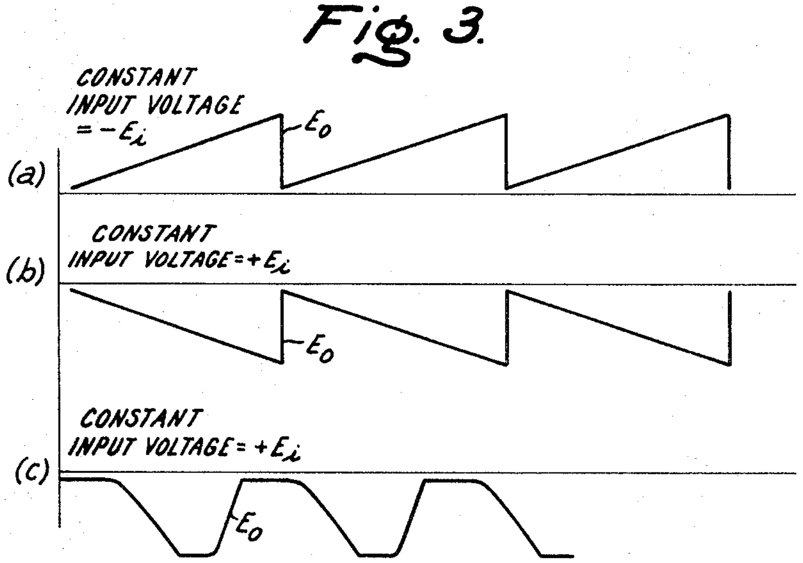
Figure 4:
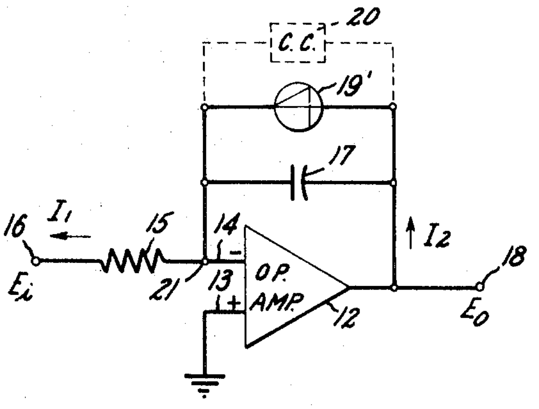

FIGS. 3*a* and 3*b* are waveform diagrams for the circuit of FIG. 1 showing respectively the periodic ramp output voltage for negative and positive input voltages;

FIG. 3*c* is a typical output voltage waveform obtained for a positive input when the frequency is considerably higher than in FIG. 3*b*; and FIG. 4 is a schematic diagram of a modification of the invention using a unilateral voltage-sensitive switching device, further illustrating in dotted lines the addition of a commutating circuit for the voltage-sensitive switching device if required.

In FIG. 1 is shown a well-known solid state integrating circuit comprising an operational amplifier 12 connected as an integrator. Operational amplifier 12 is fabricated as a monolithic linear integrated circuit, and has a pair of differential input terminals 13 and 14 as well as a pair of power terminals coupled respectively to unidirectional voltage sources +V and −V. In order to operate as an integrator, an input resistor 15 is connected between the circuit input terminal 16 and the inverting amplifier input terminal 14, and a feedback capacitor 17 is connected between inverting input terminal 14 and the output terminal 18. The noninverting amplifier input terminal 13 is referenced to ground, as are the input signal $E_i$ and the output signal $E_o$.

By way of general background, an operational amplifier has a gain that is real and large. With the choice of inverting input and the proper choice of feedback elements and the relative values of the feedback elements, these amplifiers can be made to produce an output which is proportional to the algebraic sum, the time derivative, the integral with respect to time, or simply a multiple of the input signal voltage or other mathematical operation. For use as an integrator the feedback elements are an input resistor and a feedback capacitor connected as shown in FIG. 1. With the circuit arranged in this manner, the output voltage $E_o$ is the constant 1/RC times the integral of the input voltage $E_i$ with respect to time. When the input voltage is a constant, the output voltage is a linear ramp whose instantaneous value is 1/RC times the product of the input voltage $E_i$ and the time, i.e., $E_o = -E_i t/RC$. Assuming that the input resistor 15 has a value $R = 10^6$ ohms and that the feedback capacitor 17 has a value $C = 10^{16}$ farad, the transfer function of the integrator is 1 rad/sec. As an example, if the magnitude of $E_i$ were set equal to 1 volt, then $E_o$ would rise at a rate of 1 volt/sec. Operational amplifiers have been constructed in a variety of circuit configurations, and the invention can be practiced with any suitable operational amplifier so long as the integrating circuit produces a linear ramp in response to a constant unidirectional input voltage. The operational amplifier should be one that is fabricated in integrated circuit form, and preferably as a monolithic integrated circuit. It is not essential that the operational amplifier have differential inputs, although most such amplifiers do and in this case one of the inputs can be referenced to ground. A suitable operational amplifier that can be used is identified as the $\mu$A709C integrated operational amplifier manufactured by Fairchild Semiconductor, Fairchild Camera and Instrument Corporation, Mountainview, California. This monolithic linear integrated circuit operational amplifier is similar to the widely used Fairchild $\mu$A709 amplifier that is further described with the aid of a schematic circuit diagram, to which the reader may refer to for further information, in the article "Inside the Operational Amplifier" published in ELECTRONICS MAGAZINE, Oct. 16, 1967, pp. 86—93. A number of monolithic integrated circuit operational amplifiers available from other manufacturers are similar to this basic circuit.

The integrated operational amplifier is eminently suited as a component of a periodic ramp generator, since it has low output impedance, high gain, and positive and negative input/output capability. These desirable characteristics provide driving power, stability, and flexibility, respectively. Furthermore, the ramp voltage that is produced when a constant input voltage is applied to the integrating circuit is highly linear. In accordance with the invention, a periodic ramp output voltage is generated by combining with the operational amplifier integrating circuit a solid state voltage-sensitive switching device or devices connected to periodically discharge the feedback capacitor and thereby reset the circuit. In this way, a highly linear sawtooth voltage is produced over a wide range of frequency of operation. The voltage-sensitive switching device is preferably a voltage-sensitive breakover-type switching device, and can be a unilateral or bilateral device or combination of devices, such as for example the silicon bilateral switch, the silicon unilateral switch, the diac, the fourlayer diode, the Zener diode, etc. For the sake of circuit simplicity the voltage-sensitive switching device should be a nongate device, however it is within the scope of the invention to use a gated device such as the SCR and the triac provided that these devices are provided with gating circuits that trigger the device at a predetermined voltage level. It is preferred, however, that the voltage-sensitive switching device be one that is capable of fabrication in integrated circuit form, and that it be a bilateral or unilateral thyristor-type device depending upon whether both positive and negative output voltage polarity capability is desired, or only positive output voltage or negative output voltable capability.

Figure 2:
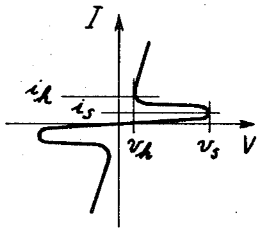
FIG. 2 is a current-voltage characteristic curve for the bilateral voltage-sensitive switching device shown in FIG. 1.

In the preferred embodiment of the invention illustrated in FIG. 1, the voltage-sensitive breakover switching device is a silicon bilateral switch 19 connected directly across the terminals of the feedback capacitor 17, which in turn is connected between the inverting amplifier input terminal 14 and the output terminal 18. The silicon bilateral switch (SBS) is a silicon planar, monolithic integrated circuit having the electrical characteristics of a bilateral thyristor with very stable breakover voltage characteristics. The device is designed to switch from a very high to a very low impedance state when a voltage applied across the two anode or load electrodes exceeds a predetermined threshold signal level voltage, and a gate lead provided to eliminate rate effect and to obtain triggering at lower voltages is not used for this application. A suitable silicon bilateral switch device that can be used is identified as the GE-D13E1 and is further described in the aforementioned SCR Manual (pgs. 80 and 81). This particular device designed to switch at approximately 8 volts has a very low temperature coefficient and excellently matched characteristics in both directions as can be observed from both the current-voltage electrical characteristic of the device shown in FIG. 2. It will be noted from this characteristic that in order to become conductive, i.e., switch from the high-impedance state to the low-impedance state, the anode-to-cathode voltage must exceed the minimum switching voltage $v_s$ and in addition that the current through the device exceed the minimum switching current $i_s$. Once the device is rendered conductive or turned on, in order for the device to remain in the low-impedance condition the voltage across the two anode terminals must exceed the minimum value $v_h$ while the current through the device is required to be in excess of the minimum holding current $i_h$. For a silicon bilateral switch or a silicon unilateral switch, the holding current $i_h$ is typically greater than the switching current $i_s$.

To commutate off silicon bilateral switch 19 without the need for a commutation circuit, the output current I2 of the operational amplifier integrating circuit that flows into feedback capacitor 17 is selected to be greater than the minimum switching current $i_s$ of silicon bilateral switch 19 but less than the holding current $i_h$. The output current I2 of the operational amplifier integrator is equal to the input current I1 when the gain of the operational amplifier is much greater than one, as is the case here. In such an operational amplifier integrating circuit the input current I1 is simply the ratio of the input voltage $E_i$ to the resistance R of input resistor 15, hence it is easily determined.

The operation of the periodic ramp generator illustrated in FIG. 1 will be reviewed with reference to the output voltage waveform diagrams shown in FIGS. **3*a* and 3*b*. Assuming the proper selection of input and output currents in the manner already described, a constant negative input voltage $E_i$ applied to the circuit input terminal 16 produces at the output terminal 18 a positive ramp output voltage $E_o$ that rises at a rate dependent upon the magnitude of the input voltage $E_i$ and the RC time constant of input resistor 15 and feedback capacitor 17 of the integrating circuit. When the feedback capacitor 17 charges to a predetermined voltage and the instantaneous output voltage $E_o$ rises to the level of the switching voltage $v_s$ of silicon bilateral switch 19, the voltage-sensitive breakover device switches from its high-impedance state to its low-impedance state and rapidly discharges the feedback capacitor 17. Consequently, the instantaneous output voltage $E_o$ quickly drops to approximately 0 volts. At this point, the voltage across the load terminals of silicon bilateral switch 19 is also approximately 0 volts, and since the output current 12 is selected to be below the holding current $i_h$, the device turns off and reverts to its high-impedance blocking condition. The circuit is thus effectively reset, ready for another cycle of operation. When a positive polarity constant input voltage $E_i$ is used, the output periodic ramp voltage $E_o$ is negative in polarity as shown in FIG. 3*b*. The operation of the circuit for positive and negative input voltages is identical, since voltage-sensitive breakover switching device 19 is bilateral in nature and moreover has matching characteristics in both directions. As is observed in FIGS. 3*a* and 3*b***, which are reproductions of actual oscillograms recorded with a test circuit, the negative and positive polarity ramps are completely symmetrical and highly linear.

The frequency of the output periodic ramp waveform can be varied over a wide range by changing the value of the feedback capacitor 17. The frequency range is very wide, extending from less than 1 Hz. to as much as 50 kHz. At the highest frequency, referring to FIG. **3*c* which is drawn to a different scale than FIGS. 3*a* and 3*b*, the ramp is no longer completely linear due to the turn-on and turnoff times of the voltage-sensitive breakover device 19 that is used. The silicon bilateral switch device used in recording the curve in FIG. 3*c*** has a turnoff time approximately twice as long as its turn-on time, and the effect of this is seen in the shape of the curve. With the silicon bilateral switches presently available having turn-on and turnoff times in the range of a few microseconds, the characteristics of the device do not affect circuit operation until the frequency approaches approximately 10 kHz. Thus, the output periodic ramp voltage is completely linear from very low frequencies up to frequencies determined by the turn-on and turnoff times of the voltage-sensitive switch.

By way of example for a periodic ramp generator circuit employing the specific operational amplifier 12 and silicon bilateral switch 19 previously mentioned, and assuming an input voltage $E_i$ of 11 volts and a value of input resistor 15 of 100 K ohms, the value of feedback capacitor 17 is varied from 1 microfarad to 68 picofarads to produce a ramp frequency in the range of about 12 Hz. to 50 kHz. It is also possible to change the ramp frequency by varying the input voltage $E_i$, but only a 2:1 frequency ratio is obtained in this manner depending on the ratio of the holding current $i_h$ to the switching current $i_s$. When the input voltage is reduced to a low value the output voltage rises to the switching voltage but the current supplied to silicon bilateral switch 19 at this time is not sufficient to switch it into conduction. On the other hand, when the input voltage is raised to a high level the silicon bilateral switch 19 is switched into conduction and stays in its low-impedance state without commutating off, hence keeping the output of the operational amplifier at a level near zero. This small change in frequency obtained by varying the input voltage can be used to advantage in a voltage-to-frequency converter having very sensitive and stable characteristics. The frequency range in this mode of operation, previously mentioned as being a 2:1 range, can be increased by tailoring the device characteristics, i.e., increasing the ratio of $i_h$ to $i_s$.

FIG. 4 shows the integrated circuit periodic ramp generator constructed with a unilateral voltage-sensitive breakover switching device 19'. Voltage-sensitive switching device 19' is preferably a silicon unilateral switch (SUS), such as the GE-D13D1 described on page 80 of the SCR Manual. The silicon bilateral switch and the silicon unilateral switch are related in structure and manner of operation since the silicon bilateral switch is essentially two identical silicon unilateral switch structures arranged in inverse-parallel. The silicon unilateral switch has an anode-to-cathode electrical characteristic of the type given in one quadrant of FIG. 2, and operates as a switch with only one polarity of the applied voltage. The anode of unilateral switching device 19' can, of course, be connected to either the inverting amplifier input terminal 14 or the output terminal 18 depending upon whether a negative ramp or a positive ramp is desired. Connected as illustrated in FIG. 4, the application of a negative input voltage $E_i$ generates a positive periodic ramp such as is illustrated in FIG. 3*a*. To generate the negative going ramp of FIG. 3*b*, it is necessary to reverse the direction of device 19' and use a positive input voltage $E_i$.

FIG. 4 also illustrates the addition to the periodic ramp generator of a commutating circuit 20 for the voltage-sensitive breakover switching device 19', assuming that the device 19' is a thyristor or has thyristor characteristics. Communication circuit 20 is required to commutate off device 19' when the output current 12 is greater than the minimum holding current $i_h$ (see FIG. 2). In this event the thyristor switching device 19' continues to conduct and would maintain the output voltage $E_o$ at a very low value in the millivolt range or less. The commutation circuit 20 can have any suitable configuration and is conveniently triggered into operation by the rapidly falling portion of the output voltage waveform obtained when device 19' breaks over into conduction. Commutation circuit 20 applies a reverse voltage across the terminals of device 19' for a length of time greater than the turnoff time of the device, and can for example take the form of a monostable multivibrator constructed with an operational amplifier. Since the reverse voltage generated by commutation circuit 20 is also applied to the summing junction 21 of the operational amplifier integrator, it follows that the output voltage waveform can be modified according to the magnitude of the reverse voltage and the duration of time it is applied to the summing junction. For example, every other ramp of the waveform of FIG. 3*a* or FIG. 3*b* can be suppressed by operating commutation circuit 20 to supply the reverse voltage to summing junction 21 for a period equal to the period of the ramp voltage, assuming that the reverse voltage has the same magnitude as the input voltage component. It will also be understood by those skilled in the art that the abrupt fall in the output voltage $E_o$ can be differentiated to produce a sharp pulse.

The forms of the invention that have been described use two integrated circuits as the main components of the periodic ramp generator, namely operational amplifier 12 and bilateral voltage-sensitive switching device 19 or unilateral device 19'. In fabricating a periodic ramp generator circuit, of course, the two components are desirably combined as a single monolithic or hybrid linear integrated circuit. Depending upon the state of the art and the magnitudes of input resistor 15 and feedback capacitor 17, the feedback elements of the operational amplifier integrator can also be included in the integrated circuit chip. It is preferred, however, that only the operational amplifier and voltage-sensitive switching device be fabricated in monolithic form, with external connections for a discrete input resistor and a discrete feedback capacitor to allow flexibility in choosing the ramp frequency and input voltage magnitude. The periodic ramp generator constructed in this manner has the advantages of low source impedance, small size, and circuit simplicity, and is further temperature stable, accurate, and flexible. A highly linear periodic ramp voltage or sawtooth voltage is produced over a wide range of frequencies only limited by the turn-on and turnoff characteristics of the voltage-sensitive switching device. An outstanding feature is the capability of both positive and negative output polarity voltages, or only either one of these, depending on choice.

While the invention has been particularly shown and described with reference to several preferred embodiments thereof, it will be understood by those skilled in the art that the foregoing and other changes in form and details may be made therein without departing from the spirit and scope of the invention.

What I claim as new and desire to secure by Letters Patent of the United States is:

1. A periodic ramp voltage generator using integrated circuits comprising the combination of:
   an integrating circuit for producing a ramp voltage in response to the application of a constant unidirectional input voltage and including an integrated circuit operational amplifier, an input resistor connected to one input terminal of said operational amplifier, and a feedback capacitor connected between said amplifier input terminal and the output terminal of said operational amplifier; and
   voltage-sensitive switching means connected across said feedback capacitor for periodically discharging said feedback capacitor upon charging to a predetermined voltage;
   wherein said voltage-sensitive switching means is a thyristor having a characteristic switching current and holding current, and the magnitude of said input resistor and the input voltage are selected to produce an output current for charging said feedback capacitor that is greater than the switching current and less than the holding current.

2. A circuit according to claim 1 wherein said thyristor is a silicon unilateral switch.

3. A circuit according to claim 1 wherein said thyristor is a silicon bilateral switch.